US008164942B2

(12) United States Patent
Gebara et al.

(10) Patent No.: US 8,164,942 B2
(45) Date of Patent: Apr. 24, 2012

(54) HIGH PERFORMANCE EDRAM SENSE AMPLIFIER

(75) Inventors: Fadi H. Gebara, Austin, TX (US); Jente B. Kuang, Austin, TX (US); Jayakumaran Sivagnaname, Austin, TX (US); Ivan Vo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 263 days.

(21) Appl. No.: 12/697,956

(22) Filed: Feb. 1, 2010

(65) Prior Publication Data

US 2011/0188295 A1 Aug. 4, 2011

(51) Int. Cl.
*G11C 11/24* (2006.01)
*G11C 7/00* (2006.01)
*G11C 8/00* (2006.01)

(52) U.S. Cl. .............. 365/149; 365/189.05; 365/205; 365/207; 365/208

(58) Field of Classification Search .......... 365/149, 365/189.05, 205, 207, 208
See application file for complete search history.

(56) References Cited

U.S. PATENT DOCUMENTS

| 6,064,588 | A | * | 5/2000 | Crafts ........................... 365/149 |
| 6,366,491 | B1 | * | 4/2002 | Foss ............................ 365/149 |
| 6,426,905 | B1 | | 7/2002 | Dennard et al. |
| 6,618,307 | B2 | * | 9/2003 | Wickman ..................... 365/207 |
| 6,661,723 | B2 | * | 12/2003 | Foss ............................ 365/207 |
| 6,697,293 | B2 | * | 2/2004 | Brennan et al. ............... 365/207 |
| 6,711,078 | B2 | * | 3/2004 | Brennan et al. ............... 365/205 |
| 6,757,202 | B2 | | 6/2004 | McElroy et al. |
| 6,990,029 | B2 | * | 1/2006 | Hardee ......................... 365/205 |
| 7,099,216 | B2 | * | 8/2006 | Luk et al. ..................... 365/205 |
| 7,248,522 | B2 | * | 7/2007 | Hardee ......................... 365/205 |
| 7,821,858 | B2 | * | 10/2010 | Matick et al. ................. 365/207 |
| 2002/0060942 | A1 | | 5/2002 | Akiyama et al. |
| 2003/0026153 | A1 | | 2/2003 | Blodgett |
| 2005/0007849 | A1 | | 1/2005 | Sommer |
| 2005/0162931 | A1 | | 7/2005 | Portmann et al. |
| 2009/0040810 | A1 | | 2/2009 | Forbes |

* cited by examiner

*Primary Examiner* — Trong Phan
(74) *Attorney, Agent, or Firm* — Brevetto Group

(57) ABSTRACT

Embedded dynamic random access memory (eDRAM) sense amplifier circuitry in which a bit line connected to each of a first plurality of eDRAM cells is controlled by cell control lines tied to each of the cells. During a READ operation the eDRAM cell releases its charge indicating its digital state. The digital charge propagates through the eDRAM sense amplifier circuitry to a mid-rail amplifier inverter circuit which amplifies the charge and provides it to a latch circuit. The latch circuit, in turn, inverts the charge to correctly represent at its output the logical value stored in the eDRAM cell being read, and returns the charge through the eDRAM sense amplifier circuitry to replenish the eDRAM cell.

15 Claims, 3 Drawing Sheets

HIGH PERFORMANCE EDRAM SENSE AMPLIFIER

BACKGROUND

1. Field of the Invention

The present invention relates to digital memory circuitry, and more specifically, to sense amplifier circuitry for embedded dynamic random access memory (eDRAM) circuits.

2. Description of Related Art

Nearly all personal computers use some form dynamic random access memories (DRAM). Each DRAM cell can store one bit of information. Reading, or detecting, the bit stored in a DRAM cell destroys the charge in the cell defining the bit, which must then be replenished in order to maintain the stored bit. DRAM sense circuits are used to read the bit stored in cells, and then replenish the charge in the cell to maintain the bit, either as a logical "1" or "0". DRAM circuitry has been adapted for a number of uses, including for example, embedded dynamic random access memory (eDRAM) circuits.

An eDRAM is a DRAM that is integrated on the same die or configured within the same package as its processor or ASIC (Application Specific Integrated Circuit), or like types of logic or circuitry. Since eDRAM circuitry embeds DRAM cells with their corresponding processor or ASIC, eDRAM avoids the need for I/O signals to travel between separate memory chips. As such, eDRAM tends to be faster and more efficient, using less power and increasing the performance of the processor and memory functions than previous DRAM technology. Nonetheless, conventional eDRAM circuits do suffer from certain drawbacks, leaving room for improvement. For instance, conventional eDRAM sense amplifiers can connect to only a limited number of cells, typically no more than thirty-two cells. For additional cells designers must gang together additional conventional sense circuitry. One reason for this is that conventional eDRAM sense circuits lack enough sensitivity in their amplifier section. If too many cells are connected to a conventional eDRAM sense circuit then the amplifier section cannot accurately detect individual released charges resulting in data errors. Another drawback related to the lack of amplifier sensitivity is that the access speeds of conventional eDRAM sense circuits tend to be limited, thus inhibiting further increases in processor clock speed.

The present inventors recognized the need for improved eDRAM sense amplifier circuitry.

SUMMARY

Embodiments disclosed herein address the above stated needs by providing circuitry designs, and methods of using the circuitry, for an embedded dynamic random access memory (eDRAM) sense amplifier circuit. The eDRAM) sense amplifier circuit includes a bit line connected to each eDRAM memory cell. The bit line receives charges from the cells indicating the cell's digital state—a logical "1" or "0." The sense amplifier circuit has a control line connected to each of the eDRAM cells for releasing the cell's charge, and an isolation circuit connected to the bit line. A latch circuit is in communication with the isolation circuit. The output of the latch circuit is connected to an output of the eDRAM sense amplifier. A latch control signal latches the circuit to place the digital state of eDRAM memory cell, which has propagated through the circuit, on to the output line. The latch circuit output is also connected to a writeback line in communication with said bit line to place the first cell digital state on said bit line to be received by the first eDRAM cell. The isolation circuit is configured isolate the latch circuit in response to the latch control signal being manipulated to place a cell's digital state on the output line.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

Figure 1:
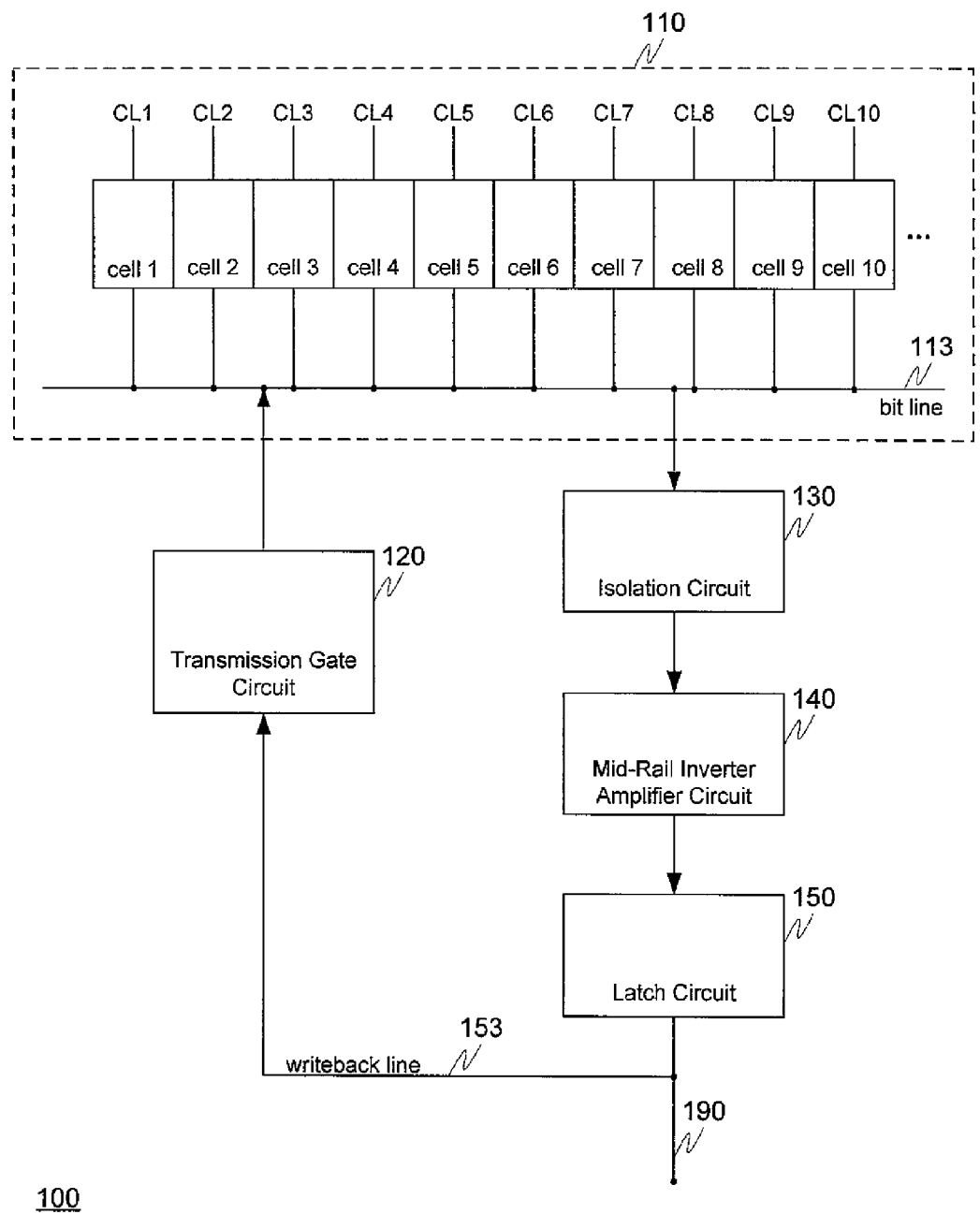
FIG. 1 depicts a block diagram of a high performance eDRAM sense amplifier circuitry according to various embodiments.

FIG. 1 depicts a block diagram of a high performance eDRAM sense amplifier circuitry according to various embodiments. Various embodiments involve improved circuitry for a high performance eDRAM sense amplifier connected to a number of eDRAM memory cells. Block 110 of FIG. 1 includes the eDRAM cells themselves, each of which is capable of holding one bit of digital information—either a logical "0" or a logical "1". Each of the eDRAM cells 1-10 can be individually controlled by a respective one of the cell control lines CL1-CL10 to release any charge it contains on to bit line 113. When a cell is read its control line controls the cell to release its charge, if any, on to bit line 113. During this time when a charge (or lack of charge) is released in order to read a cell, all the other cells are controlled to be closed. For example, if cell 3 is "opened" to release its charge, all the other cells—that is, cells 1-2 and 4-10—remained closed while cell 3 is being read and replenished. A cell containing a logical "1" holds a charge which is propagated through the circuit and back during the process of reading the cell and replenishing its charge. On the other hand, a cell containing a logical "0" holds no charge. This lack of charge is also propagated through the sense circuit and back to the cell in a similar manner in order to read the "0" in the cell. The charge representing a logical "1" in a cell may be referred to as a positive charge (high). The charge (or lack of charge) in a cell representing a logical "0" may be referred to as a low charge.

Initially, upon releasing a charge from one of the cells of block 110, the transmission gate circuit 120 is OFF (an open circuit), taking the writeback line 153 out of the circuit. The released charge of the cell is accepted by isolation circuit 130. During this initial cell release moment the input to the isolation circuit 130 is ON, allowing the isolation circuit 130 to accept the charge. The sense circuit is then controlled to turn the input to the isolation circuit 130 OFF, and turn the isolation circuit 130 output ON. This acts to pass the charge through the isolation circuit 130 on to the mid-rail inverter amplifier circuit 140.

Figure 2:
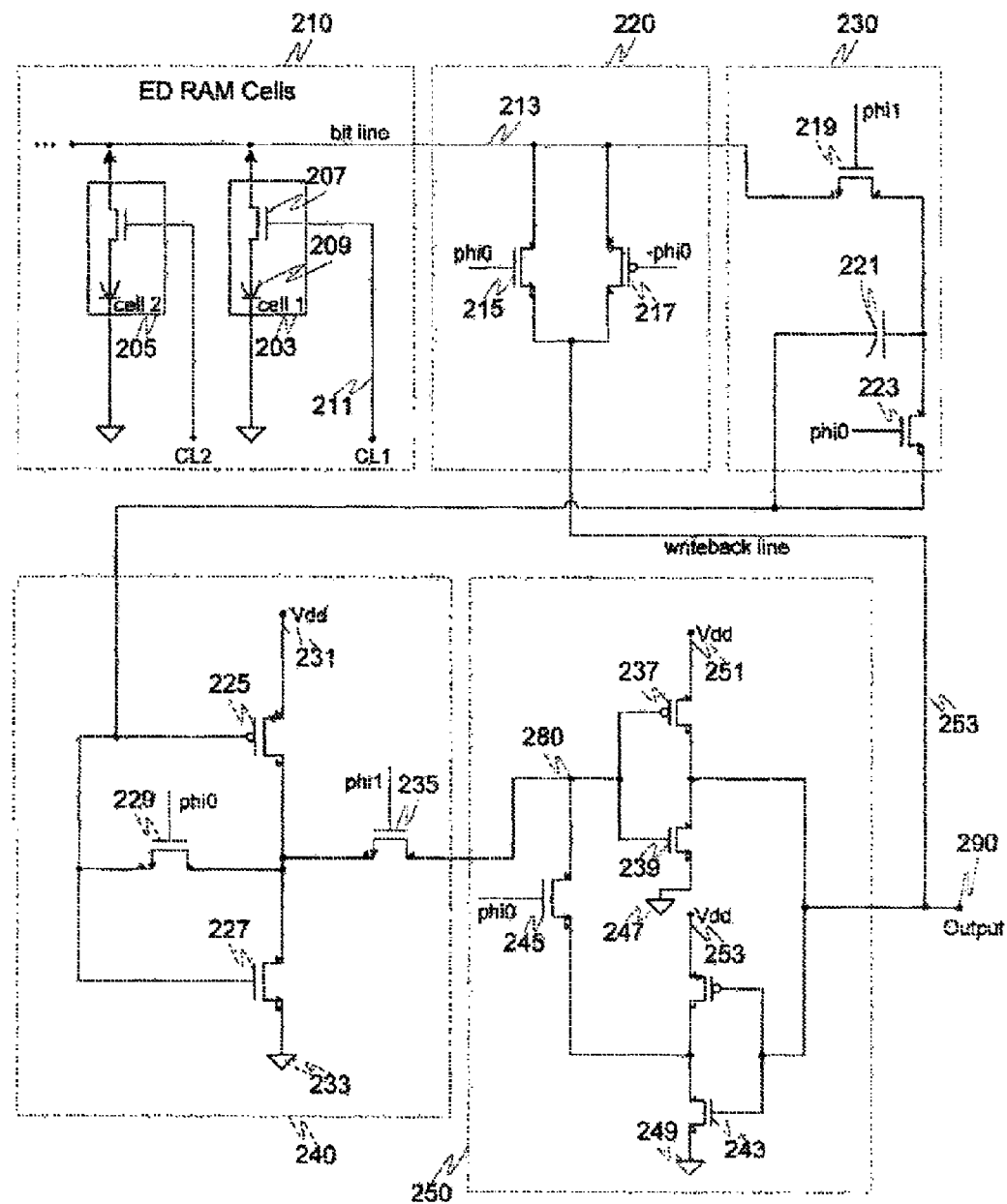
FIG. 2 depicts a circuit configuration for a high performance eDRAM sense amplifier according to various embodiments.

The mid-rail inverter amplifier circuit 140, upon reversing the charge (0 to 1, or 1 to 0 ) places the charge on latch 150. Variuos embodiments of mid-rail inverter amplifier circuit 140 are designed to be more sensitive than conventional full-rail eDRAM amplifier circuitry. Variuos mid-rail inverter amplifier circuit embodiments are described below in further detail in conjunction with FIG. 2. The latch circuit 150, in turn, reverses the charge to once again correctly represent the bit of data released from the cell in block 110 on the output line 190. The output 190 feeds the newly read bit back to its cell cell via writeback line 153, by way of transmission gate circuit 120. In this way the cell is replenished with its charge once it has been read and its bit outputted. FIG. 2. depicts further detail of the operation of eDRAM cell block 110, transimission gate circuit 120, isolation circuit 130, mid-rail inverter amplifier circuit 140 and latch circuit 150.

FIG. 2 depicts a circuit configuration for a high performance eDRAM sense amplifier according to various embodiments. Typically, eDRAM circuitry is configured from a number of p-channel and n-channel CMOS FETs (field effect transistors) located on the same die or within the same package. For example, transistor 227 of FIG. 2 is an n-channel FET and transistor 225 is a p-channel FET with the source, drain and gate configured as shown. All of the transistor gates shown in the figure with like labels (e.g., either phi0 or phi1) are tied together so as to be controlled together by a single control signal. That is, all gates labeled phi0 are tied together, or otherwise configured to be controlled together with a single phi0 control signal. Similarly, all gates labeled phi1 are also controlled together with a phi1 control signal. In this way, when phi0 is set high all the transistors with gates connected to phi0 are turned ON (closed switches) to conduct current and pass a charge. The phi0 and phi1 control signals may be referred to as transistor control signals. A particular setting of the phi0 and phi1 control signals is known as a transistor control signal state (e.g., phi0 =low, phi1=high). The phi0 and phi1 control signals are preferably non-overlapping signals inasmuch as they should not both be controlled to be high (ON) at the same time. During operation of the circuit one of the signals (phi0 or phi1) may be high while the other is low, or both may be temporarily low during a transition between states.

The circuitry within 210 represents a number of eDRAM cells. Each of the cells of the eDRAM is designed to store a bit of information, either a logical "1" or a "0," as described above in conjunction with FIG. 1. The bit of information is stored within (or on) the top plate of a cell capacitor, e.g., the capacitor 209 of cell 1. The figure depicts two cells, a first cell 203 and a second cell 205. Conventional sense amplifiers can connect to only a limited number of cells, for example, typically no more than thirty-two cells. Various embodiments of the present invention may be connected to many more eDRAM cells, for example, to as many as 128, 256, 512, 1024 or more, depending upon the configuration. For the sake of brevity in illustrating the various embodiments only two cells are depicted in 210 of the figure, cell 1 (203) and cell 2 (205), even though various implementations may have many more eDRAM cells.

As shown in FIG. 2, the bottom plates of the cell capacitors in cells 203 and 205 are each tied to ground. If there is a charge on the top plate (e.g., top plate 209) then a logical 1 is being stored in that eDRAM cell. Otherwise, the eDRAM cell holds a value of logical 0 if the top plate of its capacitor 209 has no charge stored on it. To read any particular one of the eDRAM cells a cell control voltage (or control signal) is applied to its transistor, e.g., the transistor 207 for cell 203. For example, the cell control voltage 211 applied to transistor 207 results in the release of any charge stored in cell 203. The cell control voltage may be from a voltage source, a control line, a switch connected to a source of voltage, or any other like type of logic or circuitry configured to supply a control voltage to the cell transistor gate. Once cell control voltage 211 goes high (or is otherwise turned ON) the transistor 207 of cell 203 turns ON, which is akin to a switch closing, connecting cell 203 to the bit line 213. This releases any charge that may be stored on the top plate of capacitor 209 on to bit line 213. The process of reading an eDRAM cell depletes the charge from the cell capacitor. Therefore, if the cell is to maintain its information—either a 1 bit or a 0 bit—it must be replenished after being read. This is accomplished by the circuitry of the various embodiments disclosed herein.

Some of the transistors depicted in FIG. 2 are controlled to turn ON or OFF simultaneously through the use of transistor control signals. The transistors shown in the figure with their bases labeled phi0 all turn ON/OFF simultaneously under control of the phi0 transistor control signal. Similarly, the transistors labeled with phi1 are controlled by the phi1 transistor control signal. The operation of the circuitry embodiment depicted in FIG. 2 may be most easily understood by discussing a typical scenario for reading a bit from a cell. In anticipation of executing a read operation the phi0 control is initially set low and phi1 is set high so that all of the transistors with gates controlled by the phi0 control signal are turned OFF (open) and all of the transistors with gates controlled by the phi1 control signal are turned ON (conducting). This transistor control signal state may be referred to as the propagation state since the eDRAM cell charge is being propagated through the eDRAM sense circuitry. Later, the phi0 and phi1 transistor control signals are reversed to the replenish state. Initially, in the transistor control signal propagation state with the phi0 transistors OFF and the phi1 transistors turned ON, the cell control voltage 211 is applied to the gate of transistor 207, turning it ON and releasing its charge from the top plate 209 of the cell capacitor. For the purposes of this example, it is assumed that a logical "1" is being stored in the cell 1. Storage of a "0" in the cell causes the circuitry of FIG. 2 to operate in a similar manner, except with a low charge ("0") propagating through the circuitry rather than a high charge.

The charge of cell 1, released from cell capacitor plate 209, charges bit line 213 to a high state. Since the phi0 transistors are OFF, both of transistors 215 and 217 are OFF. Note that the input to the gate of transistor 217 is inverted, but the input to 217 is actually negative phi0, so transistor 217 turns ON and OFF in unison with transistor 215. Since phi0 transistors 215 and 217 are both initially OFF (in this example) they keep writeback line 253 isolated bit line 213. The phi1 transistor 219 of circuit 230 is ON so it passes the cell charge along to capacitor 221, putting a charge on capacitor 221. Since transistor 223, a phi0 transistor, is initially OFF, this transistor does not conduct the charge.

Capacitor 221, now charged by the cell charge from cell 1, in turn passes the charge to the mid-rail inverter amplifier circuit 240. The mid-rail inverter amplifier circuit 240 operates to amplify and invert the input received from capacitor 221. In the present example (a logical 1 being propagated through the circuit), the charge from capacitor 221 is passed to the gates of the inverter formed by transistors 225 and 227. This transistors 225 and 227 form a mid-rail amplifier configuration since the amplifier output is biased at one half the Vdd supply voltage. This mid-rail amplifier configuration tends to be more sensitive than a full-rail configuration, allowing the amplifier 240 to more reliably detect eDRAM cell charges of low or marginal values. This allows for the arrangement of longer, more extensive bit lines connecting banks of eDRAM cells in greater numbers than can be achieved using conventional eDRAM sense circuitry.

Returning to FIG. 2, the phi0 transistor 229 is OFF initially, and thus remains open so long as the phi0 control remains low. Since the gate input of transistor 225 is inverted, the charge from capacitor 221 does not turn this transistor ON. Accordingly, the Vdd voltage supply 231 remains isolated from the circuit. Instead, the charge from capacitor 221 turns transistor 227 ON, passing a low signal (ground) to phi1 transistor 235. Since phi1 transistor 235 is ON it passes the low signal to the latch circuit 250. The discussion so far has concentrated on a logical 1 propagating through the circuitry. When a logical 0 is stored in the cell it propagates through in a similar manner, except the logical 0 reduces the charge on capacitor 221 instead of increasing the capacitor charge.

The low signal from the mid-rail inverter amplifier circuit 240 drives node 280, the input to latch circuit 250, to a low value. Phi0 transistor 245 is initially OFF, isolating the node 280 so that the output from the mid-rail inverter amplifier circuit 240 can be received at the latch input. The gate of transistor 239, connected to node 280, is driven low to turn OFF transistor 239 and isolate its output from ground 247. Instead, since the gate of transistor 237 is connected to node 280 via an inverter, the low input applied to node 280 in this example turns transistor 237 ON. This, in turn, applies the Vdd voltage source 251 to the latch output connected to output line 290. In this way the cell charge released from cell 1 propagates through the circuit and results in a high signal, or logical 1, at output 290.

Once the cell charge from cell 1 has made its way through the circuit to output 290, the phi0 and phi1 control lines can be changed to set phi0 to high and phi1 to low. This transistor control signal state may be referred to as the replenishment state since the writeback line is being used to replenish the eDRAM cell charge back into the eDRAM to complete the read operation. Changing the transistor control signals from their first state (propagation state) to a second state (replenishment state) controls the various transistors of the circuit to switch the phi0 transistors from OFF to ON (closed, conducting), and switch the phi1 transistors from ON to OFF (open, non-conducting). This may be done while the cell control line 211 remains high in order to replenish the cell 1 charge to its original value, in this example a logical 1. Changing the state of the transistor control signals causes the latch circuit 250 to remain stable at its present value, in this example, logical 1. Since the output node 290 is high (Vdd), the transistor 243 is turned ON, passing ground voltage 249 to transistor 245. The phi0 transistor 245, now turned ON in response to phi0 being set to high, passes the ground voltage 249 to the latch input at node 280, stabilizing the latch value at a logical 1.

The latch output at node 290 is connected writeback line 253 which conducts the output value to phi0 transistors 215 and 217 of the transistor gate circuit 220. Transistors 215 and 217, both having been turned ON, transmit the high at output node 290 to once again charge the bit line 213. Note that phi1 transistor 219 is now turned OFF, isolating the capacitor 221 from the transistor gate circuit 220. Further, the phi0 transistor 223 is now ON, equalizing the charge on the plates of capacitor 221. In this example, since cell 1 released a logical "1" charge which propagated through the circuitry to eventually turn on transistor 227, the capacitor charge will be dissipated to ground 233 via inverter amplifier circuit transistor 227.

Turning to bit line 213, this node is now high in the present example since the transistor gate circuit 220 is ON, passing the high from the output node 290 via writeback line 253. The bit line 213 acts to recharge cell 1, placing a charge on the top plate 209 of the cell capacitor. In this way the cell is recharged after being read and having its value placed on the output of latch 250, output 290. Once cell 1 has been replenished the cell 1 control CL1 can be manipulated to turn transistor 207 off, thus isolating cell 1 once again so it can retain its data bit of memory storage.

Figure 3:
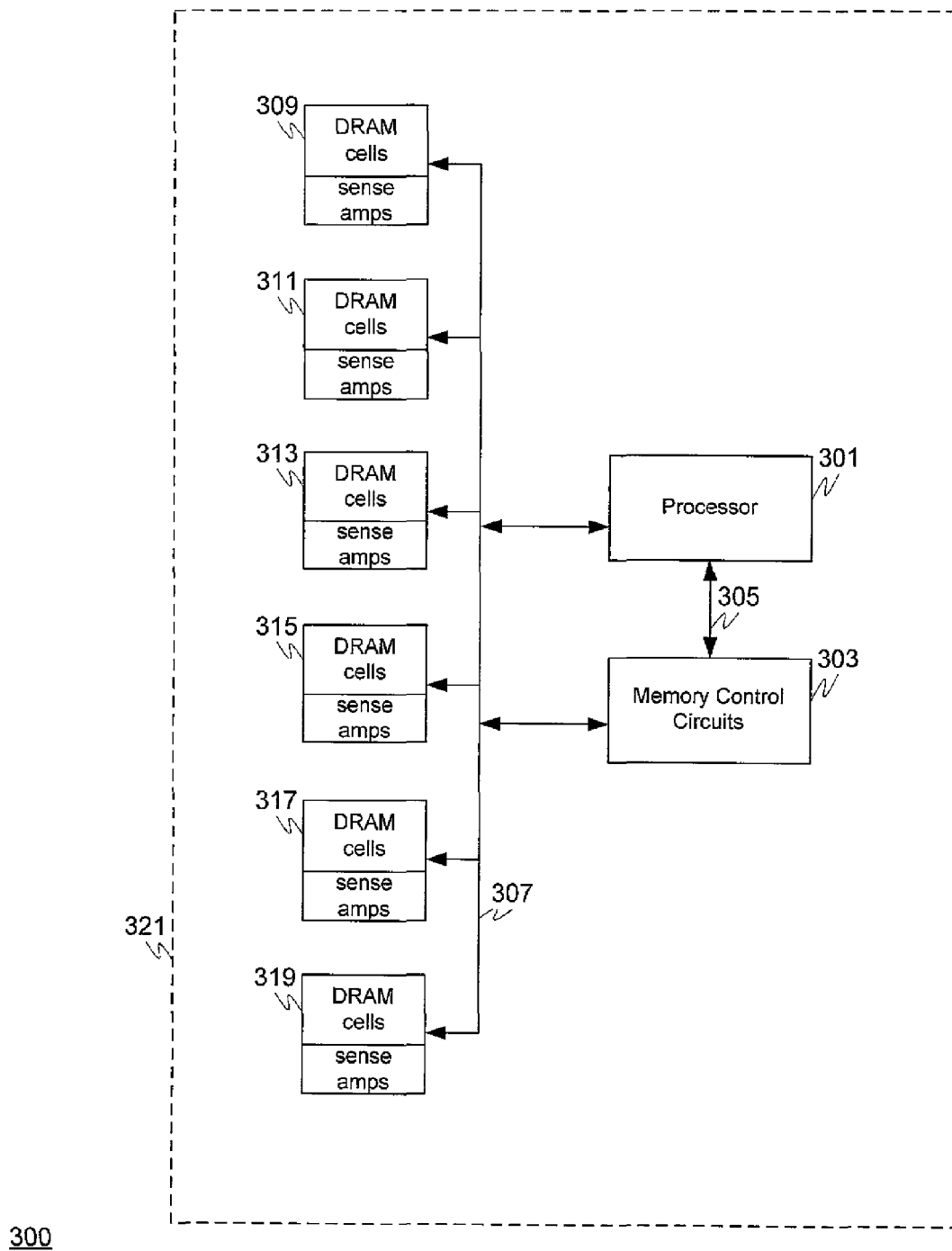
FIG. 3 depicts eDRAM sense amplifiers embedded on a die with a processor.

FIG. 3 depicts eDRAM circuitry embedded on a semiconductor die 321 with a processor 301. The die may be silicon (Si), gallium arsenide (GaAs), or any other semiconductor material known to those skilled in the art. The circuitry of FIG. 3 includes eDRAM cells 309 through 319, memory control circuits 303 along with the processor 301 co-located on the same semiconductor die or within the same package. The memory control circuits 303 are configured to provide control lines for reading the eDRAM cells 309 through 319.

The memory control circuits 303 are typically connected to each eDRAM cell by a control line, for example, cell control lines CL1-CL10 of FIG. 1. Each bank of eDRAM circuitry 309-319 includes eDRAM cells for storing digital information as well as sense amplifier circuitry for reading the stored bits. Data and control signals may transferred between processor 301 and memory control circuits 303 via bus 305. Similarly, data and control signals between memory control circuits 303 and eDRAM circuitry 309-319 are placed on the bus 307. In some embodiments the processor 301 may communicate directly with eDRAM memory circuitry 309-319. In other embodiments the processor 301 may communicate with the control circuits 303, which in turn communicate with eDRAM memory circuitry 309-319.

Input devices may also be configured to communicate signals to the various components of FIG. 3. Such input devices may include a keyboard, mouse, touch-pad, or other like device configured to accept inputs into the system 300. The system 300 may also include one or more output devices such as a display screen, printer, audio speakers, or other like type of device configured to provide output data to a user, or disk drives or communication interfaces for storing or communicating the outputs.

The various embodiments may be implemented with many different types of processors 301, including microprocessors, controllers, or logic circuitry. For example, an eDRAM according to the various embodiments may be associated with a microprocessor, microcontroller, digital signal processor (DSP), reduced instruction set chip (RISC) processor, two or more parallel processors, or any other type of processing unit, circuitry or logic that one of ordinary skill would recognize as being capable of performing or controlling the functions and activities described herein. A processing unit in accordance with at least one of the various embodiments can operate computer software programs stored (embodied) on computer-readable medium such those compatible with disk drives, a storage drive, or any other type of hard disk drive, CD, flash memory, ram, or other computer readable medium as recognized by those of ordinary skill in the art.

Various components of the circuitry are described as being connected to, or in communication with, other circuitry components. One circuit component is "connected" to another circuit component if it passes signals to or otherwise communicates signals to the other circuit component. A first circuit component may be connected to a second via a third circuit component. For example, isolation circuit 130 of FIG. 1 is connected to latch circuit 150 via mid-rail inverter amplifier circuit 140. As such, isolation circuit 130 is in communication with latch circuit 150. However, isolation circuit 130 is not "directly connected" to latch circuit 150 mid-rail inverter amplifier circuit 140. Instead, isolation circuit 130 of FIG. 1 is directly connected to mid-rail inverter amplifier circuit 140. The mid-rail inverter amplifier circuit 140 itself is directly connected to latch circuit 150.

The description of the various embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the intended scope of the present invention.

What is claimed is:

1. An embedded dynamic random access memory (eDRAM) sense amplifier circuit comprising:
    a first plurality of control lines each respectively connected to one of a plurality of eDRAM cells, wherein a first eDRAM cell is configured to release a charge indicating a digital state of the first eDRAM cell in response to a signal from a first control line of said first plurality of control lines;
    a mid-rail amplifier circuit configured to amplify said charge indicating the digital state of the first eDRAM cell;
    a latch circuit with an input connected to an output of the mid-rail amplifier circuit, an output of the latch circuit being connected to an output of the eDRAM sense amplifier; and
    a writeback line connected to the output of the latch circuit.

2. The eDRAM sense amplifier circuit of claim 1, further comprising:
    a bit line connected to each of the plurality of eDRAM cells including the first eDRAM cell;
    wherein the writeback line connects the output of the latch circuit to the bit line.

3. The eDRAM sense amplifier circuit of claim 2, wherein the mid-rail amplifier circuit is in communication with said bit line.

4. The eDRAM sense amplifier circuit of claim 3, further comprising:
    a capacitor connected in parallel with a transistor;
    wherein the mid-rail amplifier circuit is in communication with said bit line via the capacitor connected in parallel with the transistor.

5. The eDRAM sense amplifier circuit of claim 4, further comprising:
    a second plurality of transistor control lines configured to control transistors within the eDRAM sense amplifier circuit.

6. The eDRAM sense amplifier circuit of claim 5, wherein a value at the output of the latch circuit is returned back to the first eDRAM cell via the writeback line in response to changing the second plurality of transistor control lines from a first state to a second state.

7. The eDRAM sense amplifier circuit of claim 6, wherein said transistor in parallel with the capacitor is one of the transistors controlled by the second plurality of transistor control lines.

8. The eDRAM sense amplifier circuit of claim 1, wherein the charge indicating the digital state of the first eDRAM is a positive charge and the digital state is a logical "1".

9. The eDRAM sense amplifier circuit of claim 2, wherein the writeback line connects the output of the latch circuit to the bit line via a transistor gate circuit comprising a pair of transistors connected in parallel, said pair of transistors being controlled by the second plurality of transistor control lines.

10. The eDRAM sense amplifier circuit of claim 1, wherein the charge is a first charge, the eDRAM sense amplifier circuit further comprising:
    a second eDRAM cell configured to release a second charge on a bit line.

11. An eDRAM sense amplifier circuit, comprising:
    a mid-rail amplifier circuit and configured to amplify a charge indicating a digital state of an eDRAM cell;
    a latch circuit with an input in communication with an output of the mid-rail amplifier circuit, an output of the latch circuit being configured to provide a signal to an output of the eDRAM sense amplifier;
    a capacitor connected in parallel with a transistor, wherein the mid-rail amplifier circuit is in communication with a bit line of the eDRAM cell via said capacitor in parallel with the transistor; and
    a writeback line connecting the output of the latch circuit and the bit line.

12. The eDRAM sense amplifier circuit of claim 11, wherein said eDRAM cell is one of a plurality of eDRAM cells, the eDRAM sense amplifier circuit further comprising:
    a first plurality of control lines each respectively controlling one of the plurality of eDRAM cells, wherein said eDRAM cell is configured to release the charge in response to a signal from a first control line of said first plurality of control lines.

13. The eDRAM sense amplifier circuit of claim 12, further comprising:
    a second plurality of transistor control lines configured to control transistors within the eDRAM sense amplifier circuit;
    wherein said transistor in parallel with the capacitor is one of the transistors controlled by the second plurality of transistor control lines.

14. The eDRAM sense amplifier circuit of claim 13, wherein a value at the output of the latch circuit is returned back to the eDRAM cell via the writeback line in response to changing the second plurality of transistor control lines from a first state to a second state.

15. The eDRAM sense amplifier circuit of claim 14, wherein the writeback line connects the output of the latch circuit to the bit line via a transistor gate circuit comprising a pair of transistors connected in parallel, said pair of transistors being controlled by the second plurality of transistor control lines.

* * * * *